United States Patent [19]

Shelor

[11] Patent Number: 5,668,470

[45] Date of Patent: *Sep. 16, 1997

[54] AUTOMATIC TESTING SYSTEM FOR MAGNETORESISTIVE HEADS

[75] Inventor: John Richard Shelor, San Diego, Calif.

[73] Assignee: Phase Metrics, San Diego, Calif.

[*] Notice: The term of this patent shall not extend beyond the expiration date of Pat. No. 5,517,111.

[21] Appl. No.: 609,853

[22] Filed: Mar. 1, 1996

Related U.S. Application Data

[63] Continuation of Ser. No. 405,797, Mar. 16, 1995, Pat. No. 5,517,111.

[51] Int. Cl.$^6$ .................................................. G01R 33/06
[52] U.S. Cl. ............................................................ 324/202
[58] Field of Search .................................. 324/235, 202, 324/251, 252, 228, 117 R, 117 H; 338/32 R, 32 H; 364/571.07, 571.01

[56] References Cited

U.S. PATENT DOCUMENTS

| | | |
|---|---|---|
| 4,488,112 | 12/1984 | Thompson et al. . |
| 4,491,794 | 1/1985 | Daley et al. . |
| 4,514,687 | 4/1985 | Van Husen . |
| 4,692,697 | 9/1987 | Bray . |
| 4,771,237 | 9/1988 | Daley . |
| 5,043,666 | 8/1991 | Tavernetti et al. . |
| 5,343,145 | 8/1994 | Wellman et al. . |
| 5,517,111 | 5/1996 | Shelor ................................. 324/235 |

Primary Examiner—Sandra L. O'Shea
Assistant Examiner—Roger Phillips
Attorney, Agent, or Firm—Blakely Sokoloff Taylor & Zafman

[57] ABSTRACT

A preprogrammed controller, preferably a stored program computer such as an IBM PC computer, is programmed to automatically control all the steps in the testing of a MR reproduce head. First, the magnitude of the sense current is established by command of the controller, and a voltage proportional to the sense current flowing in the head is monitored by the controller. An electromagnet, having high permeability pole pieces, and whose current is programmed by the controller provides a the magnetic field for exciting the MR head. The MR device is placed on an measured magnetic equipotential of the field of the electromagnet, and a Hall sensor magnetic detector is placed on the same magnetic equipotential line but in a different physical position from the MR device. The output of the Hall sensor is fed into the preamplifier electronics, digitized by a converter and this digital output is stored in the controller memory for future processing. Preamplifier electronics are also fed from the voltage output of the MR head, and the controller initiates a series of voltage measurements which are digitized and stored in the controller memory. By controlling the current to the electromagnet driver, the test field at the MR element is swept from a minimum field value to a maximum field value and back again, while correlated voltage data from the head is acquired.

11 Claims, 4 Drawing Sheets

AUTOMATIC TESTING SYSTEM FOR MAGNETORESISTIVE HEADS

This is a Continuation Application of Application Ser. No. 08/405,797 filed Mar. 16, 1985 now U.S. Pat. No. 5,517,111.

BACKGROUND OF THE INVENTION

1. Field of the Invention

As magnetic recording technology continues to push areal recording density limits, magnetoresistive (MR) reproduce heads are the current technology of choice. Both shielded and unshielded MR heads are known in the art, and these heads have the advantage of high signal output level, independence of output level on head/media velocity, excellent short wavelength response and ease of fabrication. By use of electrodeposition techniques, mass production methods are being applied to MR head fabrication and large quantities of MR heads are manufactured using well known wafer processing techniques.

In the prior art, the necessary testing of these heads has proceeded at a slow pace. Generally, manual techniques are presently employed. To perform a test, a sense current through the test head's magnetoresistive strip is manually established. The head may be self biased by means of the sense current, or it may be biased by a deposited magnet incorporated into the head during the manufacturing process, or by other means known in the art. The head is then subjected to an excitation field directed along the response axis of the head, corresponding to the magnetic signal field read when the head is in use. Generally, in testing in the prior art, this field is generated by means of Helmholtz coils, and the magnitude of the field is calibrated in terms of the current flowing in the coils. Helmholtz coils provide accurately determinable fields but are limited to relatively low amplitude magnetic fields since the Helmholtz coil contains no high permeability pole pieces, but operates in empty space. In the prior art, the amplitude of the field at the head is generally determined by the calibrated current flowing in the Helmholtz coils, and the field level per reading is established by manual control of the current. With the field level established, a voltage measurement is made across the head's MR element, providing a data point for the manually set magnetic field and sense current. The efficiency of data collection in a manufacturing environment is limited by the low amplitude of magnetic field available from the Helmholtz coils, and the manual acquisition of the data on a point by point basis. The data is generally displayed in an analog graph form, and not being directly available for digital data processing typically results in derivation of qualitative rather than quantitative MR device parameters.

SUMMARY OF THE INVENTION

A preprogrammed controller, preferably a stored program computer such as an IBM PC computer, is programmed to automatically control all the steps in the testing of a MR reproduce head. First, the magnitude of the sense current is established by command of the controller, and a voltage proportional to the sense current flowing in the head is monitored by the controller. An electromagnet, having high permeability pole pieces, and whose current is programmed by the controller provides a the magnetic field for exciting the MR head. The MR device is placed on an measured magnetic equipotential of the field of the electromagnet, and a Hall sensor magnetic detector is placed on the same magnetic equipotential but in a different physical position from the MR device. The output of the Hall sensor is fed into the preamplifier electronics, digitized by a converter and this digital output is stored in the controller memory for future processing. Preamplifier electronics are also fed from the voltage output of the MR head, and the controller initiates a series of voltage measurements which are digitized and stored in the controller memory. The entire process is programmed by the controller. By controlling the current to the electromagnet driver, the test field at the MR element is swept from a minimum field value to a maximum field value and back again, while correlated voltage data from the head is acquired.

BRIEF DESCRIPTION OF THE DRAWINGS

The invention will be described with reference to the drawings of which.

DESCRIPTION OF THE PREFERRED EMBODIMENTS

Figure 1:
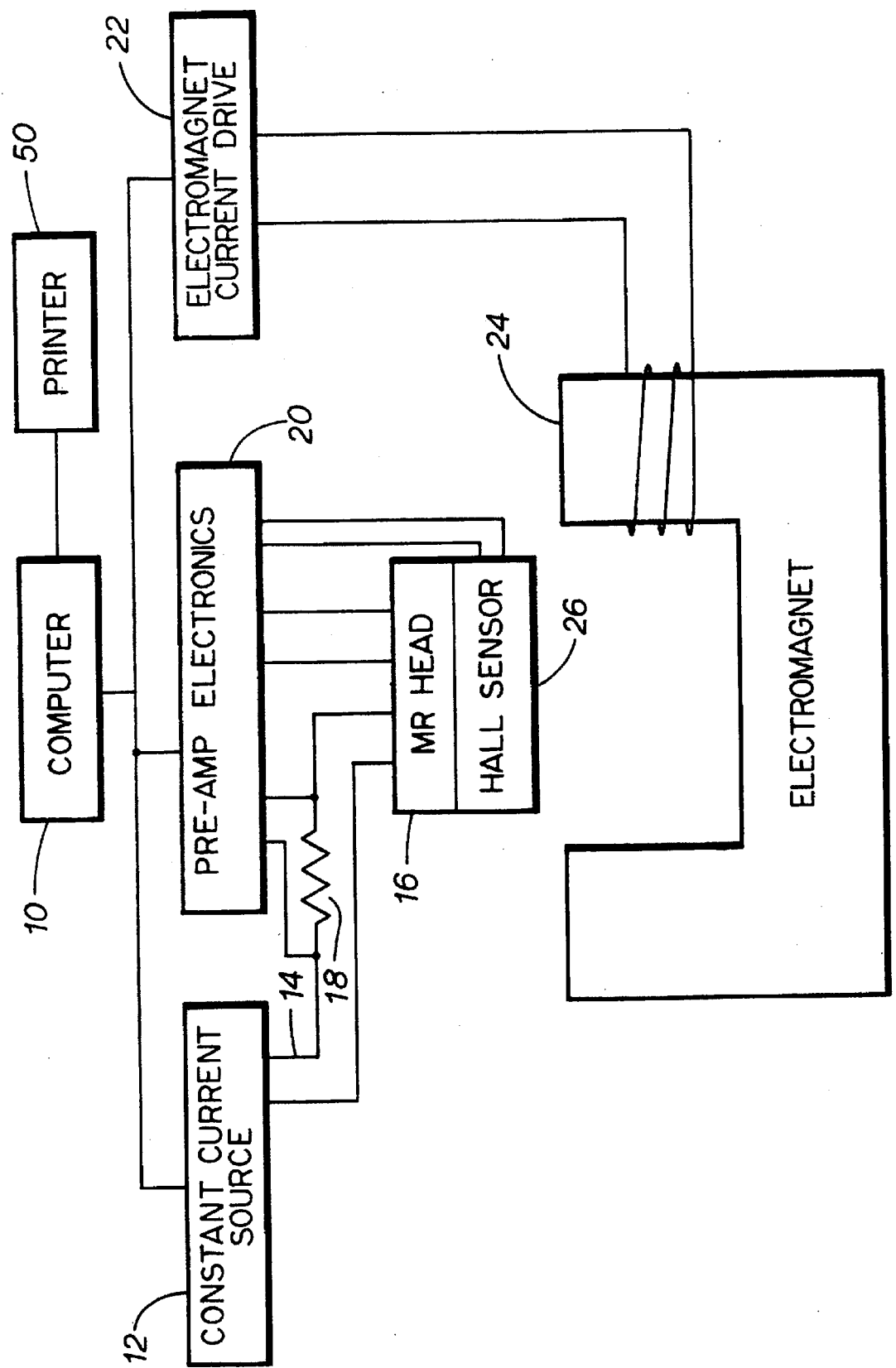
FIG. 1 is a block diagram showing the interconnections among elements of the invention.

Referring to FIG. 1, a computer 10 provides the control signals to the component elements of the MR head automatic tester, acquires the data in each step of the test cycle, and performs the calculations necessary to reduce and display the data. The first step in the test process is to establish the constant sense current through the MR element. A controllable constant current source 12 is fed a digital value from the computer 10 establishing the sense current 14 in the MR element 16. The current 14 flows through a precision resistor 18, and the voltage drop across the resistor 18 is applied to one section of pre-amplifier electronics package 20. The computer 10 digitizes the output signal from the pre-amplifier package 20 to obtain the measured sense current value and compares it to the original digitally input value. The computer 10 adjusts the output of the constant current source 12 until the measured current value agrees with the digital value input by the computer 10.

With the sense current value established, the computer 10 initiates a sub-routine to control the electromagnet 24 current in a pre selected manner. An arbitrary current waveform may be input to the electromagnet current drive 22 to establish a corresponding field pattern in the electromagnet 24. It will be noted, that in testing unshielded MR heads the field at the head is generally cycled from +100 Oe to −100 Oe, while for a shielded head the field is cycled from −300 Oe to +300 Oe. The change in range is simply effected by changing the digital values for current transmitted from the computer 10 to the electromagnet current drive 22. Complete flexibility in range selection for the magnetic field is thus provided.

Figure 2:
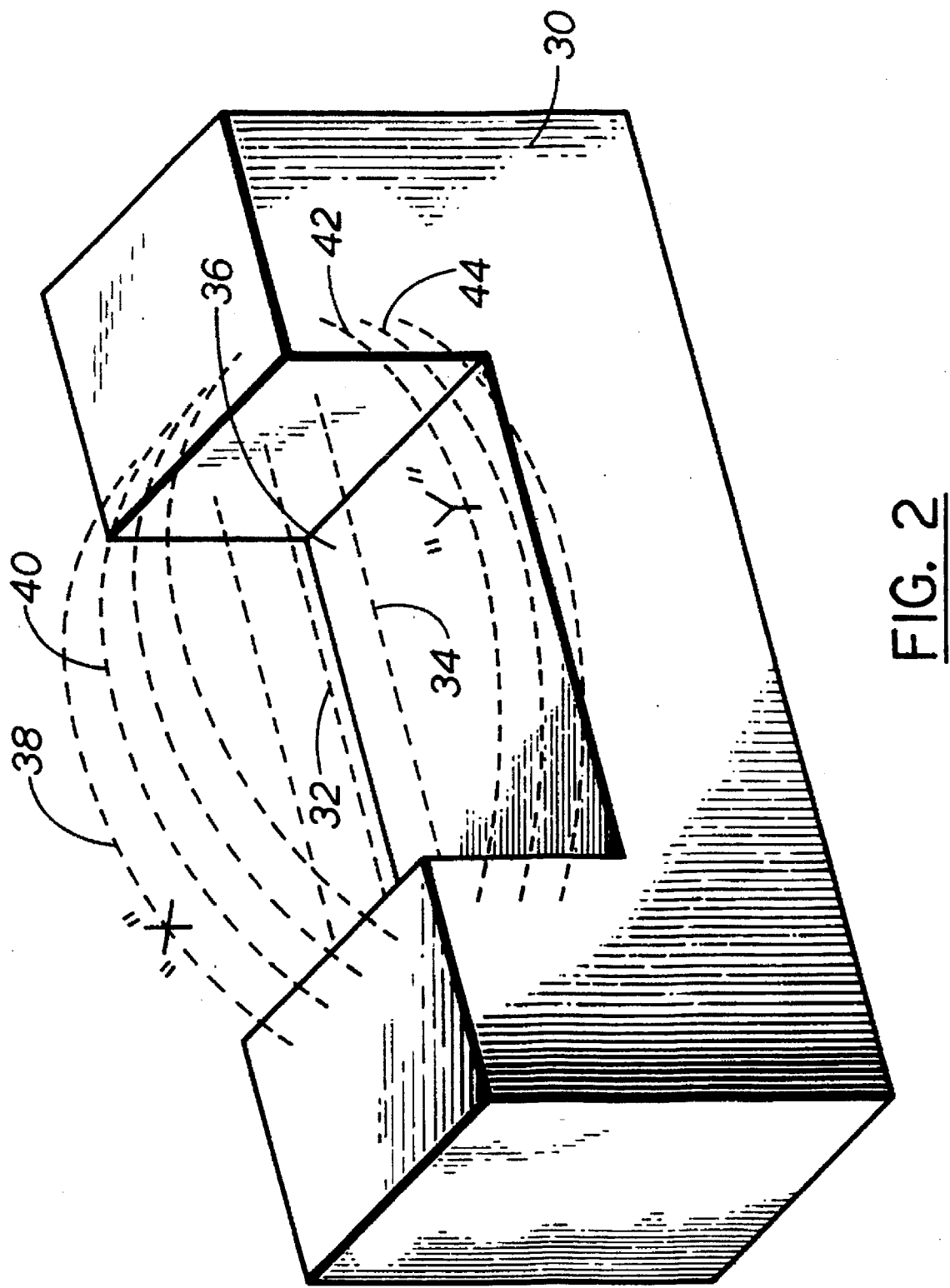
FIG. 2 is a drawing of the core of the electromagnet that provides the magnet field used in the invention.

By means of the technique described below, it will be noted that the magnetic field value at the MR head 16 is identical in value with the field measurement of the Hall sensor 26. In using the electromagnet 24 with its high permeability magnetic core rather than a Helmholtz coil to provide the magnetic field, a larger range of field amplitudes is available, and equally important, a great deal of flexibility is available in the placement in the magnetic field of the MR head 16 and the Hall sensor 26. Referring to FIG. 2, the high permeability core 30 of the electromagnet 24 (shown without the magnet's coil winding for clarity) is seen with relatively uniform field lines 32,34 within the gap 36. Because the gap length of the core 30 is conventionally short, there may not be enough volume to allow insertion of the MR head 16 and the Hall sensor 26 into the gap proper. However, the core 30 also has a fringing field at the top of the core (as seen in FIG. 2) e.g. 38, 40, and a fringing field at the sides of the core, e.g. 42,44. These field lines, 38–42 spread out from the top and sides of the core allowing placement of the MR head and the Hall sensor in the open regions adjacent to the top and the sides of the core 30. Prior to use of the fringing field in testing, the field intensities locations are calibrated by placing the Hall sensor 26 in the fringing field around the core 30 by means of an accurate positioning device, to be described below, and the magnetic equipotential intensities determined as a function of location relative to the core 30. For example, under a given current value in the electromagnet coil, the intensity at the field line 38 may be, say, 60 Oe, while simultaneously the field line 42 at the side of the core 30 also has the value of 60 Oe. This allows, during an actual test, placing the MR head 16 at position "X" on magnetic equipotential 38 having the value 60 Oe, while placing the Hall sensor 26 on the magnetic equipotential at position "Y" also having the value 60 Oe. Thus, the MR head 16 and the Hall sensor 26 are subjected to the same magnetic field intensity, i.e. 60 Oe, without the MR head 16 and the Hall sensor 26 physically interfering with each other. By careful fringing field measurement and selection of the equipotential locations "X", "Y" the magnetic field values at the MR head 16 and at the Hall sensor 26 remain equal over the range of field values during a test. It should be noted that certain head configurations may be physically small enough to allow insertion of the head assembly into the gap proper. This is generally the case for rows of head diced out from a wafer or heads mounted on disk hardware (HGA). For these head configurations, the same sequence described above in determining the value of magnetic field at the head is followed, albeit that it takes place within the gap.

To establish the test cycle time an arbitrary current waveform may be input to the electromagnet 24, but typically in the testing process a stepped waveform approximating a ramp is employed. While the operator has complete flexibility in selecting the time required for a test run, consider as an example, a test cycle time of 2 secs. to test an unshielded MR head throughout the field range of −100 Oe to +100 Oe. For a complete test, the field is ramped up from the minimum value to the maximum value, and then is ramped down in the opposite direction, where it takes 1 sec to sweep each segment of the ramp. With the MR element 16 and the Hall sensor in position on equivalued magnetic equipotentials as described above, data is taken for each sweep of the current ramp. Assuming 2400 steps over each direction of ramp sweep, i.e. 2400 steps per 1 second, each incremental step value of the magnetic field (0.083 Oe) lasts for, and is applied to, the MR element for 417 microseconds. During a test run the output of the MR 16 head, and the output of the Hall magnetic field sensor 26 are continually sampled at a 14 KHz rate by means of the computer 10, so that during each 417 microsecond field step approximately 6 samples of MR voltage and 6 samples of actual magnetic field amplitude are measured and stored. In this example, the MR device output voltage and magnetic field measurement are oversampled 6 times at each programmed level of the electromagnetic field ramp. In the subsequent processing of the data each set of the 6 samples is averaged by the computer 10 to minimize the effects of random noise which may have been present in the raw data. Oversampling may be performed either by means of a high speed multiplexer and a single analog to digital converter, or by means of multiple converters operating in parallel.

Figure 3:
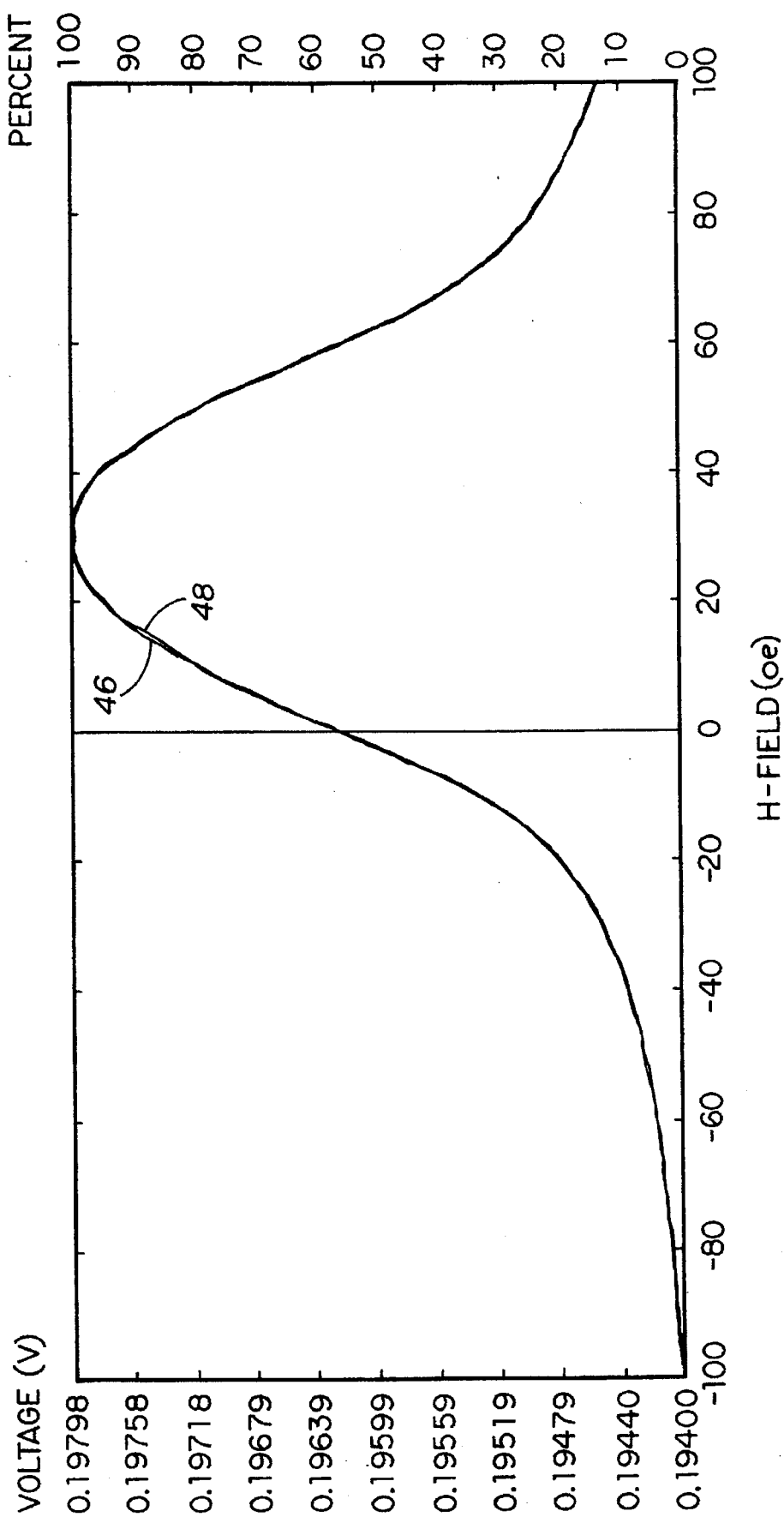
FIG. 3 is a graph of a typical MR head response generated by the apparatus of the invention.

Referring to FIG. 3, a pair of automatically plotted response curves 46,48 for an unshielded MR head over a magnetic field range of −100 Oe to +100 Oe are plotted. As previously described, the magnetic field is ramped from −100 Oe to +100 Oe while simultaneously MR head response data is acquired along with corresponding magnetic field values. This increasing field ramp produces the data which is displayed in the curve 46. The current in the electromagnet 24 is then ramped down in the reverse direction from +100 Oe to −100 Oe, data acquisition is continued and processed as previously described. This decreasing field ramp produces the data which is displayed in the curve 48. This oversampled data is reduced by the computer 10, and the output curves 46,48 are plotted by plotter 50.

Figure 4:
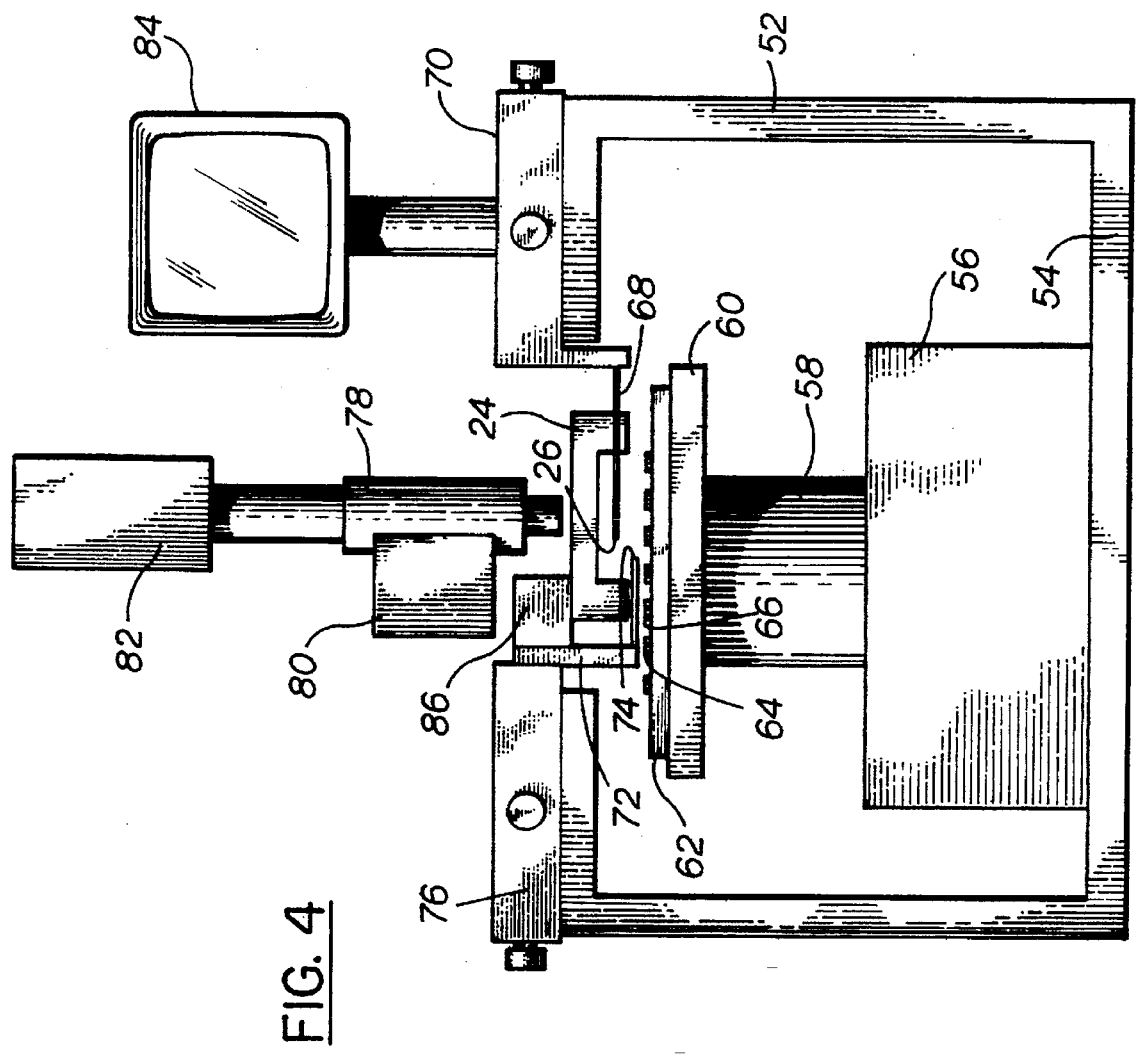
FIG. 4 is a drawing of the mechanical assemblage of units of the invention.

The apparatus of the invention is implemented to automatically test MR heads in the form of single heads, heads mounted on disk hardware (HGA), heads in wafer form, or heads in row form diced from wafers, which are head configurations well known in the prior art. Referring to FIG. 4, the mechanical assemblage of the apparatus is contained in an enclosure 52, having a base 54. Mounted in the enclosure 52, is an XY positioner 56, a Z axis stage 58 and a vacuum chuck 60. (The XY plane is parallel to the base 54, and the Z axis is perpendicular to the XY plane.) A wafer 62 having an array of MR head elements, e.g. 64,66 is shown mounted on the vacuum chuck 60, and the head array is positionable in the XY plane by means of XY positioner 52, and along the Z axis by means of the Z axis stage 58. The electromagnet 24 is mounted above the wafer 62, and the MR head elements, e.g. 64,66 are in the fringing field of the electromagnet 24 as previously described. A Hall probe 68, having the Hall sensor 26 mounted on the end of the Hall probe 68 is positionable by means of the Hall probe positioner 70. A head probe 70, having at its end probe needles 74 for making electrical contact to the head elements, e.g. 64,66 ( connections as shown in FIG. 1) is positionable by the needle probe positioner 76. A microscope 78 having an illuminator 80 provides a field of view of the MR head elements e.g. 64,66, the probe needles 74, and the Hall sensor 26. A camera 82 may be provided to display the field of the microscope 78 on a camera monitor 84. The electronic package 86, contains the constant current source 12, pre amplifier electronics 20, and electromagnet drive 22 electrically connected as shown in FIG. 1. The electronics package 86 is connected to the computer 10 and plotter 50 (not shown in FIG. 4) as seen in FIG. 1.

The invention has been described in detail with particular reference to preferred embodiments thereof, but it will be understood that variations and modifications can be effected within the spirit and scope of the invention. For example, using techniques known in the computer art, in the testing a row of heads or heads on a wafer, the XY positioner may be automatically controlled on completion of a head test to sequentially step to the next head and for the computer to initiate the next test run.

What is claimed is:

1. A tester that tests a magnetic recording head, comprising:

a magnetic core which has a pair of poles;

a coil coupled to said magnetic core;

a drive circuit which provides a current to said coil, wherein said current creates a magnetic field that excites the magnetic recording head;

a sensor that senses the magnetic field, said sensor and the magnetic recording head being located between said poles of said magnetic core: and, a pre-amp circuit that measures an output signal created by the excited magnetic recording head.

2. The tester as recited in claim 1, wherein said drive circuit varies an amplitude of the current to create a waveform which has a linear slope.

3. The tester as recited in claim 1, wherein the waveform has a positive linear slope and a negative linear slope.

4. The tester as recited in claim 1, further comprising a sensor which senses the magnetic field created by the current of said coil.

5. A tester that tests a magnetic recording head, comprising:

a drive circuit that provides a current, said drive circuit varies an amplitude of the current to create a waveform which has a linear slope;

an electromagnetic device which receives the current and creates a magnetic field that excites the magnetic recording head; and, a pre-amp circuit that measures an output signal created by the excited magnetic recording head.

6. The tester as recited in claim 5, wherein the waveform has a positive linear slope and a negative linear slope.

7. The tester as recited in claim 5, further comprising a sensor which senses the magnetic field created by said electromagnetic device.

8. The tester as recited in claim 5, wherein said electromagnetic device includes a coil that receives the current and is coupled to a magnetic core.

9. The tester as recited in claim 8, wherein said magnetic core has a pair of poles and the magnetic recording head and said sensor are located between said poles.

10. A method for testing a magnetic recording head, comprising the steps of:

a) providing a current to a electromagnetic device to create a current which excites the magnetic recording head;

b) varying an amplitude of the current to create a waveform that has a linear slope; and, c) measuring an output signal of the excited magnetic recording head.

11. The method as recited in claim 10, wherein the waveform has a positive linear slope and a negative linear slope.

* * * * *